United States Patent [19]

Ishihara

[11] 4,322,753

[45] Mar. 30, 1982

[54] SMEAR AND/OR BLOOMING IN A SOLID STATE CHARGE TRANSFER IMAGE PICKUP DEVICE

[75] Inventor: Yasuo Ishihara, Tokyo, Japan

[73] Assignee: Nippon Electric Co., Ltd., Tokyo, Japan

[21] Appl. No.: 156,335

[22] Filed: Jun. 4, 1980

[30] Foreign Application Priority Data

Jun. 8, 1979 [JP] Japan .................................. 54-72035

[51] Int. Cl.³ .............................................. H04N 3/14
[52] U.S. Cl. ......................................... 358/213; 357/24
[58] Field of Search ........................ 358/212, 213, 44; 250/208, 209, 211 R, 211 J; 357/24, 29, 30

[56] References Cited

U.S. PATENT DOCUMENTS 4,010,319  3/1977  Levine ................................. 358/213
4,174,528 11/1979  White .................................. 358/213

OTHER PUBLICATIONS

Blooming Suppression in Charge Coupled Area Imaging Devices, Séquin, Bell System Tech. Journal, Oct. 1972, pp. 1923–1926.
AntiBlooming: A New Approach for Linear Imagers, Mauthe, IEEE Journal of Solid State Circuits, vol. SC-11, No. 4, pp. 547–550, Aug. 76.
The Charge–Coupled Device as a TV Image Sensor, Brown, GEC Journal of Science & Tech., vol. 43, #3 (1977) pp. 125–134.

Primary Examiner—Michael A. Masinick
Attorney, Agent, or Firm—Laff, Whitesel, Conte & Saret

[57] ABSTRACT

Charges are accumulated in photosenstive elements on a semiconductor substrate and are transferred into a memory portion or to vertical shift registers, with transfer occurring at a high speed. The charges produce an output series of electrical signals which are delivered at a normal speed. The memories and similar portions of the substrate may be completely light-shielded. An amount of the charges flowing into the first vertical shift register may be made extremely small due to the high-speed transfer, in order to minimize a "smear" phenomenon (i.e., charges which stray through the integrated semiconductor material). Also, an intensive incident light might cause a charge overflow (called "blooming") from the photosensitive elements into the nearby first vertical shift register currently transferring the charges. By operating the first vertical shift register at a high speed, the charges of one picture field may be stored temporarily in the memory portion to reduce the use time of the first vertical shift register. Thus, the remaining available use time of the first vertical shift register may be employed to discard the charges collected undesirably in the first vertical shift registers.

14 Claims, 9 Drawing Figures

SMEAR AND/OR BLOOMING IN A SOLID STATE CHARGE TRANSFER IMAGE PICKUP DEVICE

The present invention relates to an image pickup device using a charge transfer device.

As the charge transfer image pickup device, a frame transfer type and an interline transfer type have been developed. These devices have found a rapidly expanding use, because of the advantages peculiar to the solid state device such as small size, light weight, low power consumption, and high reliability. The charge transfer image pickup device, used an image pickup device, has advantageous characteristics in low noise, residual image, burning and the like, but it also has disadvantageous characteristics in blooming, and smear phenomenon (crosstalk), as compared to other imaging devices.

A conventional charge-coupled transfer device of the interline transfer type has a plurality of columns of photo-sensitive elements arranged in parallel on a single semiconductor substrate. Charge transfer vertical shift registers are interlined with the rows of those elements. One end of each vertical shift register is coupled with a horizontal shift register, which is further coupled at one end to a charge detecting portion. An amount of each of the charges, corresponding to an amount of light detected by the photo-sensitive elements, is transferred to the vertical shift registers and collected through the vertical shift registers by the horizontal shift register. The collected charges are taken out from the charge detecting portion in the form of a series of voltages. The photo sensitive elements are usually formed either by areas having a conductivity type which is opposite to that of the semiconductor substrate or by transparent electrodes on the semiconductor substrate surface with an oxide layer interposed therebetween. Those photo-sensitive elements accumulate charges produced by the action of light incident on the substrate. A metal light-shield layer is additionally formed for shielding portions other than the photo-sensitive elements from the incident light.

Although such a light-shield layer is used, undesirable charges are freed in the substrate at locations having no photosensitive elements. These charges may result from light obliquely incident on the photo-sensitive elements, the light which impinges on the oxide layer and reflects within the oxide layer, or the like. The freed charges move in the substrate to reach the vertical shift register and often to be merged in the flow of charges in the vertical shift register. This behavior of the free charges prevents the voltage obtained as the result of the photo-electric conversion from faithfully corresponding to an image that is picked up. The amount of charges applied to the vertical shift registers are not uniform, so that the difference in average light amounts in the vertical lines appears as the difference in dark output levels, which causes a phenomenon called "smear".

The amounts of charges stored in the photo-sensitive elements are limited. Accordingly, an amount of charge, produced when an intensive light is incident to the photo sensitive elements, frequently exceeds the limit of the charge storage capacity of the photo-sensitive element. Then the excessive amount of charge overflows from the elements, to become stored in the adjacent elements or to flow into the vertical shift registers. Particularly, the charges flowing into the vertical registers give rise to a pattern of white stripes on the reproduced picture. The charge flowing into the adjacent elements remarkably deteriorates the resolution of the reproduced picture. This phenomenon is generally called "blooming".

Accordingly, an object of the invention is to provide a charge transfer image pickup device and an image pickup apparatus which are free from both the smear and the blooming.

According to one aspect of the present invention, a charge transfer image pickup device is formed on a semiconductor substrate. A photo-sensitive area in the device includes a first plurality of columns of photo-sensitive elements, a plurality of parallel vertical shift registers corresponding to rows of photo-sensitive elements. A plurality of transfer gates are each disposed between corresponding one of columns of photo-sensitive elements and corresponding one of first vertical shift registers. A memory portion includes a second plurality of series vertical shift registers, each corresponding to an individually associated vertical shift register. A horizontal shift register receives charges transferred from second vertical shift registers and transfers them. At one end of the horizontal shift register, its output converts a quantity of charges, transferred from the horizontal shift register to an electrical signal.

According to another aspect of the present invention, an image pickup apparatus comprises: an image pickup device formed on a semiconductor chip and including a plurality of photo-sensitive elements arranged in rows and columns. The photo-sensitive elements accumulate charges in response to light incident thereon. A plurality of first vertical shift registers are disposed parallel to the rows of the photo-sensitive elements. A plurality of transfer gates are disposed between columns of photo-sensitive elements and the first shift registor to control the transfer of charges from the photo-sensitive element to the first vertical shift register. A plurality of second vertical shift registers are each arranged in a series to correspond to the first vertical shift registers. A horizontal shift register transfers charges from second vertical shift registers and converts the charges to an electrical signal. A transfer signal generator supplies a transfer signal to the transfer gates for transferring charges accumulated in the photo-sensitive element to first vertical shift register. A first shift signal generator supplies a first shift signal to first and second vertical shift registers for transferring charges, previously transferred to the first vertical shift registers, to the second vertical shift registers at a high speed. The first shift signal is produced after the transfer signal and has a high frequency. A second shift signal generator supplies a second shift signal to second shift registers for transferring charges, transferred to the second vertical shift registers, to the horizontal shift registers at a normal speed, which is lower than the above high speed. The second shift signal is produced after the first shift signal and has a frequency which is lower than the high frequency. A third shift signal generator supplies a third shift signal to the horizontal shift register for transferring charges, previously transferred to the horizontal shift register, to the output means.

According to the present invention, charges accumulated in the photo-sensitive elements are transferred to the memory portion or the second vertical shift registers, via the vertical shift register at a high speed and derived from the output in the form of a series electrical signal, at a normal speed. The memory portion or the like may be light-shielded, completely. An amount of charges flowing into the first vertical shift register may be made extremely small due to the high speed transfer, and thus the smear phenomenon may be minimized. As described above, by operating the first vertical shift register at a high speed, the charges of one picture field may be stored temporarily in the memory portion or the like, to reduce the use time of the first vertical shift register. Thus, by the remaining use time of the first vertical shift register, enables the undesirably collected charges in the first vertical shift registers to be discarded through the first vertical shift register. This discard is achieved by transferring charges collected in the first vertical shift registers in the direction opposite to the memory portion, along the first vertical shift registers. Accordingly, an intensive incident light is prevented from causing the charge to overflow from the photo-sensitive elements into the near first vertical shift register, currently transferring the charges.

As described above, the present invention may prevent both the smear and the blooming. Further, even if the first vertical shift register is operated at a high speed, the signal charges may be taken out from the memory portion or the like to the horizontal shift register at a normal speed. The picture quality obtained by the invented devices is comparable to that by the conventional device.

The above and other objects and features of the invention will become more apparent from the following description taken in conjunction with the accompanying drawings; wherein.

Figure 1:
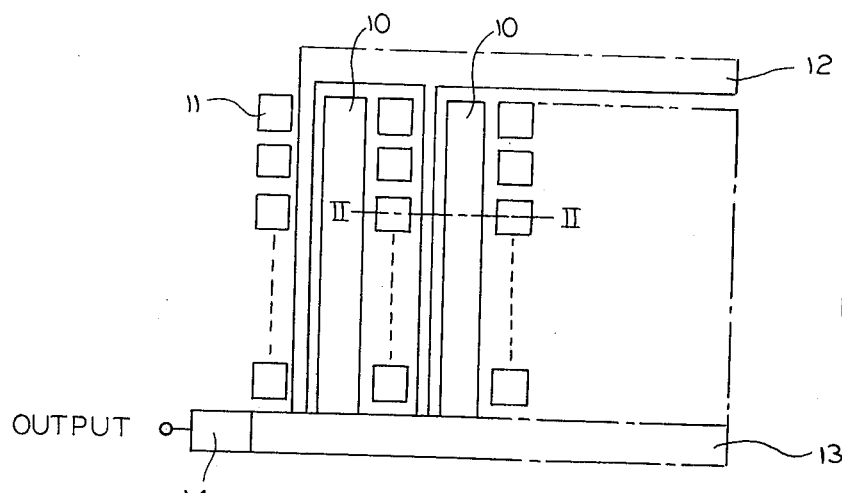
FIG. 1 is a partial schematic diagram for explaining the construction of a conventional image pickup device of the interline transfer type.

FIG. 1 shows a conventional charge transfer device image pickup device of the interline transfer type. The image pickup device comprises a plurality of columns of vertical shift registers 10 driven by the similar group of charge transfer electrodes, photo-sensitive elements 11 arranged in a plurality of rows. Each column is inserted between the adjacent vertical shift registers 10. A transfer gate electrode 12 controls the signal change transfer between the vertical shift register 10 and the photo-sensitive elements 11. A charge transfer horizontal shift register 13 is electrically coupled with one end of each vertical shift register 10. An output means 14 detects signal charges at one end of the horizontal shift register 13.

Figure 2A:
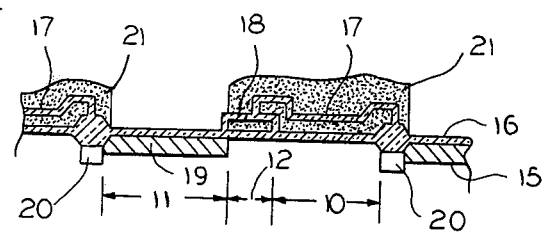
FIG. 2 (a) is a cross sectional view taken along line II—II in FIG. 1, FIG. 2 (b) is a graphical representation of a potential distribution in FIG. 2 (a) which is useful in explaining the smear phenomenon, and FIG. 2 (c) is a graphical representation of a potential distribution in FIG. 2 (a) which is useful in explaining the blooming phenomenon.

FIG. 2 (a) schematically illustrates a cross section taken along line II—II of FIG. 1, illustrating the image pickup device. Formed on the major surface of a semiconductor substrate 15 are charge transfer electrodes 17 for the vertical shift registers 10, with an insulating layer 16 interposed therebetween. The photo-sensitive elements 11 is formed by a layer 19 (P-N junction) with a conductivity type which is different from that of the semiconductor substrate 15. A transfer gate electrode 18 controls a signal charge transfer from the photo-sensitive elements 11 to the vertical shift register 10. The columns of photo-sensitive elements 11 are separated from the adjacent vertical shift registers 10 by a channel stop region 20 having, for example, a higher impurity concentration than that of the substrate 15. The portions other than the photo-sensitive elements 11 are light-shielded by a metal shield layer 21, for example.

This image pickup device of the interline transfer type thus transfers a signal charges accumulated in the photo-sensitive elements 11, corresponding to an amount of the incident light, to the corresponding vertical shift register 10, via the transfer gate 12, for example. After the signal charges are transferred to the vertical shift register 10, the transfer gate 12 is closed and the photo-sensitive elements 11 start accumulating the signal charge in the next period. The signal charges received by the vertical shift registers 10 are vertically transferred along them, to the horizontal shift register 13 for each horizontal line. The charges received by the horizontal shift register 13 are transferred in a horizontal direction, while the signal charges of the next horizontal line comes from the vertical shift registers 10. The transferred signal charges are taken from the charge detecting portion 14, as a signal.

Figure 2B:
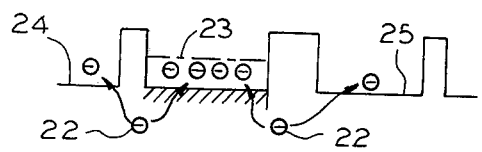

Illustrated in FIG. 2(b) is a potential profile, in the conventional charge transfer image pickup device. A light 22 illuminates the channel stop region 20 as well as the photo-sensitive elements 11 or the boundary portion between the photo-sensitive element 11 and the transfer gate electrode 12. This illumination produces charges outside of the potential well 23 of the photo-sensitive element 11 shown in FIG. 2 (b). A part of these signal charges flows into an adjacent vertical shift register 24 or a vertical shift register 25. The incident light rays, with a given incident angle relative to the major surface of the photo-sensitive elements 11, reflects at the semiconductor substrate surface and propagates laterally in the cross section shown in FIG. 2 (a). A multipath-reflection occurs in the insulating layer and/or the electrode layer formed by a polysilicon and the like. Then, the light is absorbed by the vertical shift register 10, whereby a group of charges is produced.

Figure 2C:
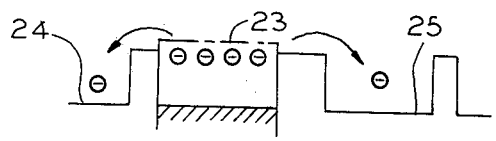

When such a phenomenon takes place during the period while the vertical shift register transfers the signal charge, a variable amount of the charge leaking into the vertical shift register 10 changes in accordance with an amount of the light absorbed by each vertical line. The difference among the average light amounts of the vertical lines provides the difference in dark output levels on a reproduced picture. This charge leakage causes a phenomenon called a "smear". Another problem may rise when an intensive light impinges on the photo-sensitive elements 11 and produces charges exceeding the maximum amount of charges which can be stored in the potential well of the photo-sensitive element 11, as illustrated in FIG. 2(c) which is a potential profile. The charges overflow from the potential well 23 of the photo-sensitive element 11 flows into the potential well 24 of the adjacent vertical shift register 10. This phenomenon is generally called "blooming" and it forms providing white lines on a reproduced picture.

Explanation to follow is for an embodiment of an image pickup device with an N channel charge transfer device, according to the present invention, which operates responsive to two-phase pulses. For example, a number of photo-sensitive elements 26 (FIG. 3) are formed on a P type semiconductor substrate and are separated from the substrate by the PN junction. As shown, those elements 26 are arranged to form a row and a plurality of such columns are arranged in parallel. Between the photo-sensitive elements 26 is a first vertical shift register 27. The respective shift registers 27 are constructed by the same charge transfer electrode group. At one end (the upper end of FIG. 3), the first vertical shift registers 27 has a charge absorbing region 28 of an N+ layer having conductivity type which is opposite to that of the substrate. Between one end of the first vertical shift registers 27 and the corresponding column of the photo-sensitive elements 26 is a transfer gate electrode 29 for controlling the transfer operation of the signal charges stored in the photo senstive elements 26, the transfer being to the first vertical shift register 27. The region having the photo-sensitive elements 26, the first vertical shift registers 27, and the transfer gate electrodes 29, will be referred to as a "photosensitive area".

A group of second vertical shift registers 31, electrically coupled with the first vertical shift register 27, is disposed at the other end (the lower side in FIG. 3) of the group of the first vertical shift registers 27 of the photosensitive area 30.

The number of the charge transfer stages of the second vertical shift registers 31 is equal to or slightly larger (but less than 10 transfer stages) than that of the first vertical shift registers 27. The second vertical shift registers 31 are driven by the similar electrode group (not shown). The second vertical shift registers 31 do not have the corresponding columns of photo-sensitive elements and the transfer gate electrode. With this structure, the electrode area required for transferring the same amount of charges as that transferred by the first vertical shift registers may be enlarged laterally, with a shorter length in the vertical direction. The second vertical shift register area will be called a "memory area" 32.

A horizontal shift register 33 is electrically coupled with the second vertical shift register 31 and is disposed at the other end (the lower side of FIG. 3) of the second vertical shift registers 31 of the memory area 32. A charge detecting portion 34 is disposed at one end of the horizontal shift register 31, through which the signal charge is taken out as an output signal.

Figure 3:
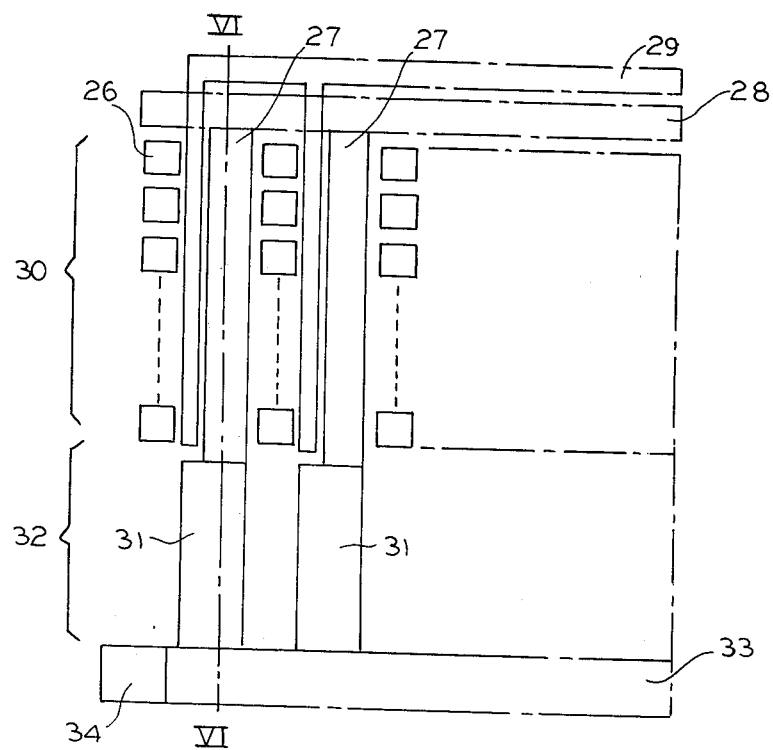
FIG. 3 is a partial schematic diagram showing an embodiment of a charge transfer image pickup device according to the present invention.
Figure 4:
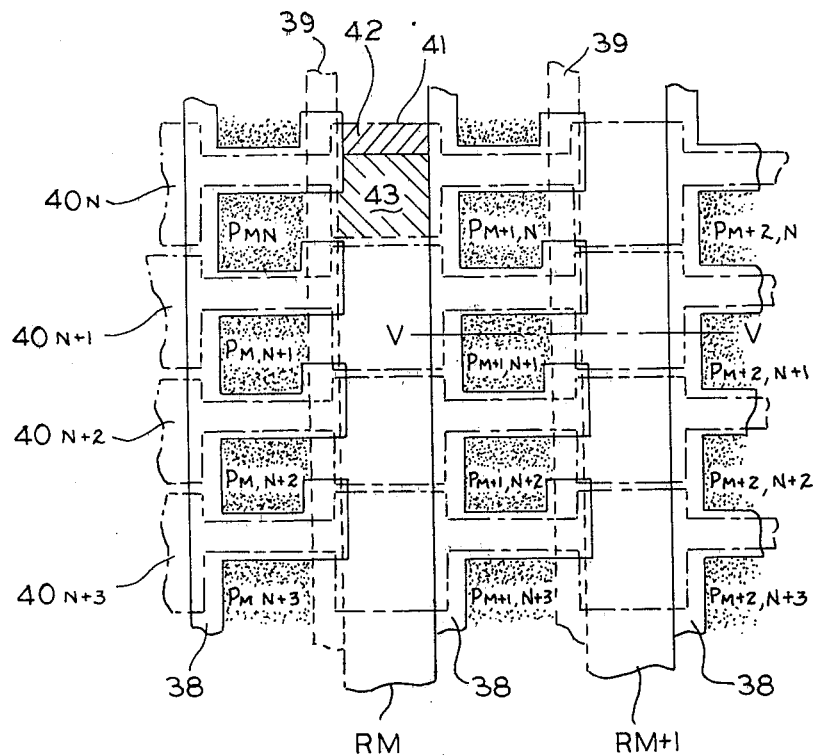
FIG. 4 is an enlarged view of a part of the light sensitive area of the image pickup device shown in FIG. 3.
Figure 5:
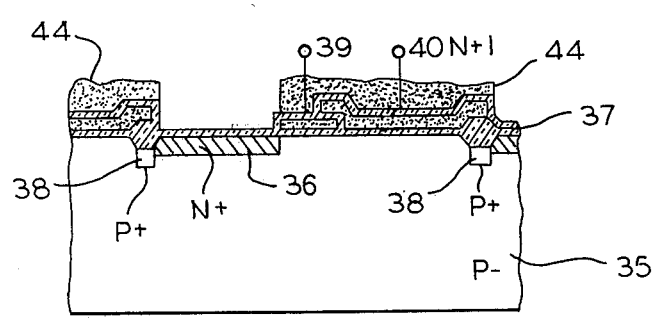
FIG. 5 is a cross sectional view taken along line V—V in FIG. 4.

FIG. 4 is an enlarged view of a part of the photosensitive area 30 shown in FIG. 3. FIG. 5 is a cross sectional view taken along line V—V shown in FIG. 4.

Photosensitive elements $P_{M,N}$, $P_{M+1,N}$ ... $P_{M,N+1}$, $P_{M+1,N+1}$ ... are formed by an N+ area 36 having a conductivity type which is opposite to that of the semiconductor substrate 35 shown in FIG. 5. The first vertical registers $R_M$, $R_{M+1}$ ... are arranged in parallel. The respective photo-sensitive elements and the first vertical shift registers are separated by channel stop region 38 having the same conductivity type as that of the semiconductor substrate 35 and having a higher impurity concentration than that of the semiconductor substrate 35, except for the concentration in the charge transfer regions between the photo-sensitive elements and its corresponding first vertical shift registers. Those channel stop regions 38 are coated with an insulating layer 37 having a given thickness.

Between the first vertical shift registers and the corresponding photo-sensitive elements, a transfer gate electrode 39 is disposed on the surface of the semiconductor substrate, with an insulating layer 37 interposed therebetween, as shown in FIG. 5. Charge transter electrodes $40_N$, $40_{N+1}$, $40_{N+2}$ ... of the first vertical shift registers are connected to the transfer electrodes of other first vertical shift registers. These charge transfers are completed through the portions above the channel stop regions 38, separating the photo-sensitive elements in a vertical direction. The charge transfer electrodes $40_N$, $40_{N+1}$, ... are arranged to be driven in a two-phase drive mode. Specifically, the electrode of each vertical shift register has two regions, a potential barrier region 42 and a charge storage region 43, as seen from an electrode 41 corresponding to the photo-sensitive element $P_{M,N}$ in FIG. 4, and is covered with a metal layer.

Accordingly, each of the transfer electrodes $40_N$, $40_{N+1}$ shown in FIG. 4 includes the potential barrier region and the charge storage region. The areas other than the photo-sensitive elements are shielded from light by means of light-shielding material 44, for example, aluminum, as shown in FIG. 5.

Figure 6:
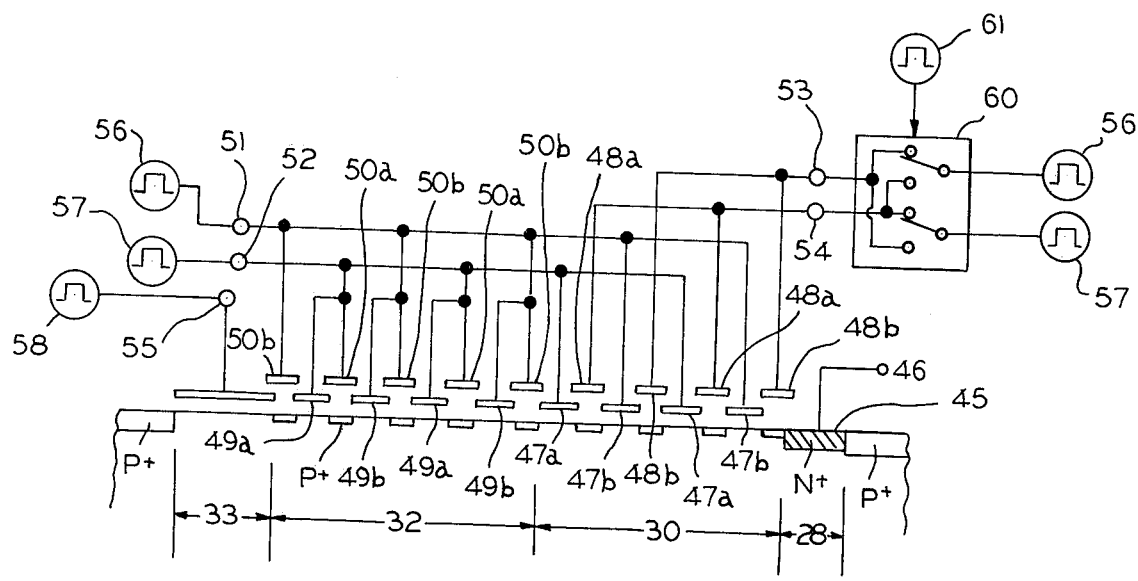
FIG. 6 is a cross sectional view taken along line VI—VI in FIG. 3.

FIG. 6 schematically illustrates a cross section taken along VI—VI (FIG. 3) line passing through the first and second vertical shift registers. Those areas are light-shielded but the light-shielding material is omitted in the disclosure of FIG. 6. As an example, the first and second vertical shift registers operate in an N-channel two-phase drive mode, each register having electrodes comprising a potential barrier region and a charge storage region. Reference numeral 45 designates an N+ region corresponding to the charge absorbing device 28 shown in FIG. 3. A bias terminal 46 is connected to the N+ region 45. Among the transfer electrodes of the photosensitive area 30 (i.e., the first vertical shift register), reference numerals 47a and 47b identify charge storage electrodes, and 48a and 48b identify potential barrier electrodes. The impurity concentration of the substrate right under those electrodes is high. The combinations of the electrodes 47a and 48a, and 47b and 48b, correspond to the transfer electrodes $40_N$, $40_{N+1}$, ... in FIG. 4. The first vertical shift register corresponds to one photo-sensitive element with respect to the combination of the storage electrode and the potential barrier electrode.

The electrodes of the first vertical shift register in this example have four electrodes forming one stage, for example, 47a, 47b, 48a and 48b which are connected to different pulse supply lines 51, 52, 53 and 54. The pulse supply lines 51 and 52 are connected to the pulse generators 56 and 57, respectively. The other pulse supply lines 53 and 54 are coupled with the pulse generators 56 and 57 via switching circuit 60, which is driven by the drive pulse generator 61.

In the transfer electrode of the memory area 32 (the second vertical shift register), the reference numerals 49a and 49b identify charge storage electrodes, and 50a and 50b and are potential barrier electrodes. With respect to the electrodes of the second vertical shift registers, the electrodes 49a and 50a and the electrodes 49b and 50b are connected in common and are also connected to two pulse supply lines 51 and 52, respectively.

The electrode 55 is a transfer electrode of a horizontal shift register which is located in the area 33 and formed by a charge transfer device operating in the two phase drive mode, acting in the vertical direction as viewed in FIG. 6. The final stage of the horizontal shift register is coupled with a charge detecting device.

The operation of the device according to the present invention will be described referring to FIGS. 3, 4, 5, 6 and 7.

Figure 7:
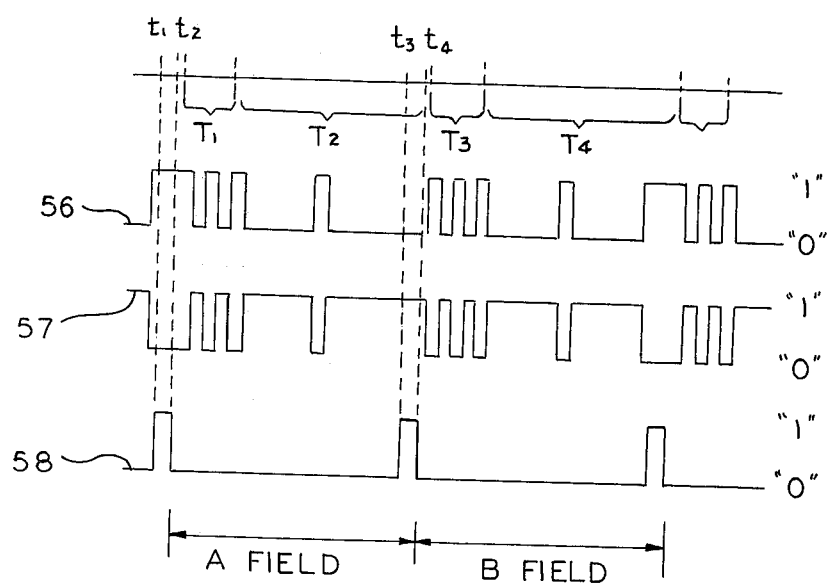
FIG. 7 illustrates waveforms of transfer pulses applied to the shift registers and pulses applied to the transfer gates, which is useful in explaining one embodiment of a method for driving the image pickup device, according to the present invention.

Waveforms 56 and 57 in FIG. 7 are produced by the pulse generators 56 and 57 in FIG. 6 and are two-phase pulse waveforms applied to the first and second vertical shift registers. These pulse waveforms 56 and 57 are applicable to the charge transfer devices having electrodes, each comprising a barrier area and a storage area. A waveform 58 is a transfer pulse waveform applicable to the transfer gate 29 or 39.

At an instant $t_1$, a pulse is applied to the transfer gate electrode. Then, the portion directly under the transfer gate becomes conductive. At this time, the pulse 56 applied to the charge storage electrode 47a of the first vertical shift register in the photosensitive area 30 is in level "1". The signal charge of the photo-sensitive elements, corresponding to the charge storage electrode 47a, is transferred to the area under the charge storage electrode 47a. At this time, the pulse 57 which is applied to the storage electrode 47b is in level "0". Therefore, the signal charge of the photo-sensitive elements, corresponding to the storage electrode 47b, cannot be transferred to the first vertical shift register. When the transfer pulse is in level "0," at an instant $t_2$, the photo-sensitive elements corresponding to the charge storage electrode 47a stores the light information of the next field. The pulse 56 is applied to the pulse supply line 54 connected to the potential barrier electrode 48a of the first vertical shift register during a period $T_1$. The pulse 57 is applied to the pulse supply line 55. At this time, the signal charges transferred to the first vertical shift register are further transferred to the second vertical shift register, constituting a memory area, with transfer occuring at a high speed during a period $T_1$.

During this period of the high speed transfer, the leakage charge caused by the smear or the overflowed charge responsive to the blooming flows from the photo-sensitive element into the first vertical shift register, as in the conventional image pickup device. Those charges, however, are proportional to a time period during which the signal charge is transferred along the first vertical shift registers. Accordingly, since the transfer speed during the period $T_1$ is higher, there is a smaller amount of the leakage charge or the overflowed charge flowing into the first vertical shift register. For example, a practical television image pickup device is a photo-sensitive area having 500 photo-sensitive elements arranged in a vertical direction. The first vertical shift register absorbs the leakage charge and the overflowed charge for 16 msec in conventional devices while it absorbs those charge only for 250 μsec when the high speed transfer is made at 1 MHz. The time for absorbing those undesirable charges are reduced to become 1/60, as compared to the time for the conventional devices.

The signal charge transferred to the second vertical shift register during the period $T_1$, is further transferred to the horizontal shift register at an interval $T_2$ (63.5 μsec in the NTSC) television system), for reading out a signal of one horizontal line.

The pulse waveforms are interchanged with each other during the period $T_2$ via the switch 60, with interchange being in such a way that the pulse 57 is applied to the pulse supply line 54. Line 54 is connected to the potential barrier electrode 48a of the first vertical shift register. The pulse 56 is applied to the pulse supply line 53 which is connected to the potential barrier electrode 48b. This application of waveforms is opposite to the application which occurs during the period $T_1$. In the first vertical shift register, the electrodes 47a and 48b and the electrodes 47b and 48b form single electrodes respectively having the charge storage regions and the potential barrier regions. Accordingly, the first vertical shift register transfers the charge in the direction opposite to the direction in which charges are transferred during the period $T_1$. In FIG. 6, the charge is transferred to the N+ region 45 for absorbing the charge which is reversely biased by the voltage applied to the terminal 46.

During the period $T_2$, there are leakage charges caused by the smear and the overflowed charges responsive to the blooming flow from the photo-sensitive elements into the first vertical shift register, as in the case of the period $T_1$. The charges, however, are absorbed by the charge absorbing device 45, so that they are never mixed with the signal charge.

When the pulse is again applied to the transfer gate electrode pulse 57 is at level "1." Therefore, during the, time between periods $t_3$ and $t_4$, the signal charges in the photo-sensitive elements correspond to the charge storage electrodes 47b of the first vertical shift register and are transferred to the storage electrodes 47b. The pulse 57 is supplied to the charge storage electrodes 47b in level "1". At this time, the pulse 56 is applied to the charge storage electrode 47a in level "0". The signal charges in the photo-sensitive elements correspond to the storage electrodes 47a and cannot be transferred to the first vertical shift register. When the transfer pulse is in level "0" after an instant $t_4$, the photo-sensitive elements corresponding to the storage electrodes 47b start accumulating the charges of the next field. During a period $T_3$, the waveform corresponding to that of the period $T_1$ is applied to each electrode. The signal charge is transferred to the second vertical shift register. During a period $T_4$, the waveform corresponding to that of the period $T_2$ is supplied to each electrode. The signal charge in the second vertical shift register is transferred to the horizontal shift register 33, while the first vertical shift register transfers the smear charge leaking and the charge overflow to the charge absorbing device.

By repeating the above-mentioned operations from the period $T_1$ to the period $T_4$, the well known operation of the interlaced scanning is performed.

The charge transfer image pickup device, according to the present invention, comprises the photosensitive area including the first vertical shift registers, columuns of photo-sensitive elements corresponding thereto, and the transfer gate electrode for controlling the transfer of the signal charges accumulated in the photo-sensitive elements. The charge absorbing device is at one end of the first vertical shift registers. The memory portion includes a second vertical shift registers connected to the other end of the first vertical shift registers. The horizontal shift register is connected to the second vertical shift register for reading out the charges therefrom. The signal charges are accumulated in the photo-sensitive elements and are transferred to the corresponding first vertical shift register. This transferred signal charge is transferred further in a direction toward the second vertical shift register. The signal charge is transferred to the second vertical shift register and is sequentially transferred to the horizontal shift register. Then, the transferred charges are derived as a series of electrical signals from the output means of the horizontal shift register.

During the period when the signal charge is transferred from the second vertical shift register to the horizontal shift register, the first vertical shift register is driven so that it transfers the charge to the charge absorbing device in a direction which is opposite to the direction of charge transfer during the period while the charge is being transferred from first to second vertical shift register. The smear and the blooming of the charge transfer device, which are inherent to the conventional device, are almost completely prevented.

While the present invention has been described as using the N channel charge transfer device, a similar image pickup device may be realized by using the P channel charge transfer device. In this case, it is sufficient that only the polarity of voltage and the conductivity type of the semiconductor device are changed.

In the above explanation of the invention, the surface channel type charge transfer device has been used in the vertical and horizontal shift registers. However, the buried channel type of charge transfer device may also be used to realize completely the same operation. While the invention has been explained in the case of the two-phase drive type charge transfer device, a four-phase drive type device ensures the same basic operations.

What is claimed is:

1. A charge transfer image pickup device comprising:
   at least one column of photo sensitive element means for accumulating charges in response to the light incident thereon;
   at least one first shift register means comprising charge transfer devices arranged parallel with said column of photosensitive element means;
   at least one transfer gate means for controlling the transfer of charges accumulated in said photosensitive element means to said first shift register means;
   at least one second shift register means comprising a charge transfer device means coupled to one end of said first shift register means for temporarily storing the charges transferred from said first shift register, said second shift register means having at least as many charge transfer stages as said first shift register means has, said second shift register means being oriented so that it does not face said photosensitive element means;
   output means for converting the quantity of charges transferred from said second shift register into an electrical signal.

2. The charge transfer image pickup device claimed in claim 1, further comprising charge-absorbing means disposed at the other end of said first shift register for extinguishing the charges transferred from said first shift register.

3. The charge transfer image pickup device claimed in claim 1, wherein there are a plurality of each of said columns of photosensitive element means, said first shift register means, said transfer gate means, and said second shift register means, all of which are formed on a single semiconductor substrate, and said output means includes a third shift register means for transferring charges transferred from said plurality of second shift register means and charge-electric conversion region means for producing a series of electrical signals in response to charges transferred along said third shift register means.

4. The charge transfer image pickup device claimed in claim 3, further comprising a plurality of charge-absorbing region means disposed at the other ends of said plurality of first shift register means for extinguishing the charges transferred from said plurality of first shift register means.

5. The charge transfer image pickup device claimed in claim 1, 2, 3 or 4, wherein regions other than said photosensitive element means are optically shielded.

6. A solid-state image pickup device formed in a semiconductor substrate comprising:
   photosensitive areas including a plurality of columns of photosensitive elements, a plurality of first vertical shift registers, each of said shift registers being arranged in parallel to a corresponding one of said columns of photosensitive elements, and a plurality of transfer gates, each of said gates being disposed between a corresponding one of said columns of photosensitive elements and a corresponding one of said first vertical shift registers;
   a memory portion including a plurality of second vertical shift registers, each of said second shift registers being coupled to one end of a corresponding one of said first vertical shift registers;
   a horizontal shift register for receiving and transferring charges transferred thereto from said second vertical shift registers; and
   an output means disposed at one end of said horizontal shift register for converting a quantity of charges transferred thereto from said horizontal shift register into electrical output signals.

7. The solid-state image pickup device claimed in claim 6, further comprising a plurality of change-absorbing regions, each of said absorbing regions being disposed at one end of a corresponding first vertical shift register which is opposite to the end coupled with said second vertical shift register, and said absorbing regions extinguishing charges transferred along said first vertical shift register to said one end.

8. An image pickup apparatus comprising:
   image pickup means formed on a semiconductor chip and including a plurality of photosensitive element means arranged in rows and columns, said photosensitive element means accumulating charges in response to light incident thereon, a plurality of first shift register means disposed in parallel to columns of said photosensitive element means, a plurality of transfer gate means disposed between a column of said photosensitive element means and said first shift register means for controlling a transfer of charges from said photosensitive element means to said first shift register means, a plurality of second shift register means, each of said second shift register means being arranged in series with a corresponding one of said first shift register means, a third shift register means for transferring charges transferred from said second shift register means, and an output means for converting charges which were transferred from said third shift register means into an electrical signal;
   transfer signal generator means for supplying a transfer signal to said transfer gate means for enabling transfer of charges accumulated in said photosensitive element means to said first shift register means;

first shift signal generator means for supplying a first shift signal to said first and second shift register means for enabling a high-speed transfer of charges from said first shift register means to said second shift register means, said first shift signal being a high frequency signal produced after said transfer signal;

second shift signal generator means for supplying a second shift signal to said second shift register means for enabling a transfer of charges from said second shift register means to said third shift register means at a speed which is lower than said high speed, said second shift signal being produced after said first shift signal and having a frequency which is lower than said high frequency; and third shift signal generator means for supplying a third shift signal to said third shift register means for transferring charges from said third shift register means to said output means.

9. An image pickup apparatus claimed in claim 8, wherein said image pickup means further includes a plurality of charge-absorbing means, each of said charge-absorbing means being disposed at one end of said first shift register means, said one end being opposite to said second shift register means, and said apparatus further comprising a fourth shift signal generator means for supplying a fourth shift signal to said first shift register means to transfer non-information charges to said charge-absorbing means, said fourth shift signal being produced after said first shift signal.

10. An integrated semiconductor circuit comprising means for accumulating charges in response to light incident thereon, said accumulative means being arranged to provide one TV picture field, means for transferring charges through said semiconductor circuit at a first speed in order to derive a series of electrical output signals which are delivered at a second speed which is slower than said first speed, whereby an amount of charges flowing through said semiconductor circuit may be made extremely small due to the transfer at said first speed in order to minimize a smear phenomenon, and means responsive to said second speed for discarding any undesirable charges which may be collected in the semiconductor material.

11. The semiconductor circuit of claim 10 wherein said semiconductor circuit comprises a plurality of shift register means for transmitting charges from said photosensitive elements to output means for deriving said series of electrical output signals, and memory means interposed between said shift register means and said output means for deriving said output signal, said memory means storing said transferred charges during the period of said transfer at said first speed.

12. The semiconductor circuit of claim 11 and means associated with each of said shift register means for absorbing at least some of the charges transferred through said shift register means in a direction opposite to said transfer which reaches said output means.

13. The semiconductor circuit of any one of the claims 10–12 and gate means in said semiconductor for controlling the transfer of charges, and means for operating said gate means in a sequence for generating odd and even fields of the TV picture resulting from said light incident to said photosensitive elements.

14. The semiconductor circuit of claim 13 and means for shielding from said incident light all of said integrated semiconductor except for said photosensitive elements.

* * * * *

UNITED STATES PATENT AND TRADEMARK OFFICE
CERTIFICATE OF CORRECTION

PATENT NO. : 4,322,753
DATED : March 30, 1982
INVENTOR(S) : YASUO ISHIHARA

It is certified that error appears in the above—identified patent and that said Letters Patent is hereby corrected as shown below:

Col. 1, Line 53, "amount" should be --amounts--;

Col. 1, Line 64, after "Then" insert --,--.

Col. 2, Line 12, delete "first" after "a";

Col. 2, Line 13, after "a" insert -- first --.

Col. 2, Line 33, "rows" should be --columns--.

Col. 3, Line 25, "invented" should be --inventive--.

Col. 5, Line 3, after "forms" delete "providing".

Col. 7, Line 67, after "NTSC" delete ")".

Col. 8, Line 10, "48b" should be --48a--;

Col. 8, Line 57, "columuns" should be --columns--.

CLAIM 7, Line 2, "change" should be --charge--.

Signed and Sealed this

Sixth Day of July 1982

[SEAL]

Attest:

GERALD J. MOSSINGHOFF

Attesting Officer    Commissioner of Patents and Trademarks